(12) United States Patent
Chen et al.

(10) Patent No.: US 12,146,213 B2
(45) Date of Patent: Nov. 19, 2024

(54) METHOD FOR REGULATING COLOR OF HARD COATING, HARD COATING, AND METHOD FOR PREPARING THE SAME

(71) Applicant: TSINGHUA UNIVERSITY, Beijing (CN)

(72) Inventors: Na Chen, Beijing (CN); Ying-Qi Zhang, Beijing (CN); Kai-Ming Zheng, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 670 days.

(21) Appl. No.: 17/222,989

(22) Filed: Apr. 5, 2021

(65) Prior Publication Data

US 2021/0222279 A1 Jul. 22, 2021

Related U.S. Application Data

(63) Continuation of application No. PCT/CN2018/114470, filed on Nov. 8, 2018.

(30) Foreign Application Priority Data

Oct. 19, 2018 (CN) .......................... 201811222261.2

(51) Int. Cl.
*C23C 14/00* (2006.01)
*C23C 14/08* (2006.01)
(Continued)

(52) U.S. Cl.
CPC ........ *C23C 14/0015* (2013.01); *C23C 14/085* (2013.01); *C23C 14/18* (2013.01); *C23C 14/35* (2013.01); *C23C 14/542* (2013.01)

(58) Field of Classification Search
CPC . C23C 14/0015; C23C 14/542; C23C 14/085; C23C 14/18; C23C 14/35; B32B 15/043
See application file for complete search history.

(56) References Cited

U.S. PATENT DOCUMENTS

2014/0268316 A1* 9/2014 Zhang ................... C03C 17/366
359/359

FOREIGN PATENT DOCUMENTS

| CN | 102560358 | 7/2012 |
|---|---|---|
| CN | 105473328 | 4/2016 |

(Continued)

OTHER PUBLICATIONS

International Search Report of PCT/CN2018/114470.

*Primary Examiner* — Kelly M Gambetta

(57) ABSTRACT

A method for regulating color of a hard coating, including the following steps: providing an amorphous alloy layer; forming an amorphous metal oxide layer on a surface of the amorphous alloy layer to stack the amorphous metal oxide layer on the amorphous alloy layer, so that the amorphous metal oxide layer and the amorphous alloy layer together form the hard coating, wherein a band gap of the amorphous metal oxide layer is in a range from 2 eV to 5 eV, and the color of the hard coating is capable of varying within the visible light spectrum depending on thickness of the amorphous metal oxide layer; and controlling the thickness of the amorphous metal oxide layer in the formation of the amorphous metal oxide layer to obtain the amorphous metal oxide layer of a predetermined color. A hard coating and a method for preparing the same are also provided.

11 Claims, 4 Drawing Sheets

(51) Int. Cl.
*C23C 14/18* (2006.01)
*C23C 14/35* (2006.01)
*C23C 14/54* (2006.01)

(56) References Cited

FOREIGN PATENT DOCUMENTS

| | | | |
|---|---|---|---|
| CN | 106521442 A | * | 3/2017 |
| CN | 106835039 | | 6/2017 |
| CN | 106835039 A | * | 6/2017 |
| CN | 107076898 | | 8/2017 |
| CN | 108004505 | | 5/2018 |
| EP | 2392689 | | 12/2011 |

* cited by examiner

METHOD FOR REGULATING COLOR OF HARD COATING, HARD COATING, AND METHOD FOR PREPARING THE SAME

CROSS-REFERENCE TO RELATED APPLICATIONS

This application claims priority of China Patent Application No. 201811222261.2, filed on Oct. 19, 2018, entitled "METHOD FOR REGULATING COLOR OF HARD COATING, HARD COATING, AND METHOD FOR PREPARING THE SAME", the content of which is hereby incorporated by reference in its entirety. This application is a continuation under 35 U.S.C. § 120 of international patent application PCT/CN2018/114470, filed on Aug. 11, 2018, the content of which is also hereby incorporated by reference in its entirety.

TECHNICAL FIELD

The present disclosure relates to the field of coatings, and particularly relates to methods for regulating color of hard coatings, hard coatings, and methods for preparing the same.

BACKGROUND

Coatings can improve the surface quality of a substrate and increase the aesthetics. With broad application prospects, coatings are widely used in various fields, such as mobile phones, computers and other IT fields, micro-nano optoelectronic devices, automobiles, medical equipment, oil and gas pipelines, power generation, oil drilling, pharmaceutical and chemical industries, and coal industry. Current coating materials are usually only capable of producing single-color coatings.

SUMMARY

In view of this, there is a need to provide a method for regulating color of a hard coating, and to provide a hard coating and a method for preparing the same.

A method for regulating color of a hard coating can include the following steps:
  providing an amorphous alloy layer;
  forming an amorphous metal oxide layer on a surface of the amorphous alloy layer to stack the amorphous metal oxide layer on the amorphous alloy layer, so that the amorphous metal oxide layer and the amorphous alloy layer together form the hard coating, wherein a band gap of the amorphous metal oxide layer is in a range from 2 eV to 5 eV, and the color of the hard coating is capable of varying within the visible light spectrum with thickness of the amorphous metal oxide layer; and
  controlling the thickness of the amorphous metal oxide layer in the forming of the amorphous metal oxide layer to obtain the amorphous metal oxide layer of a predetermined color.

In an embodiment, the band gap of the amorphous metal oxide layer is in a range from 2.2 eV to 4.5 eV.

In an embodiment, except oxygen element contained in the amorphous metal oxide layer, the amorphous alloy layer and the amorphous metal oxide layer are composed of the same elements.

In an embodiment, the elements of the amorphous alloy layer are cobalt, iron, tantalum, and boron; the elements of the amorphous metal oxide layer are cobalt, iron, tantalum, boron, and oxygen.

In an embodiment, the composition of the amorphous metal oxide layer is represented by $(Co, Fe, Ta, B)_{1-x}O_x$, wherein $0.46<x<1$.

In an embodiment, the method further includes providing a substrate and a binding layer deposited on the substrate; the amorphous alloy layer is formed on the binding layer, and is combined with the substrate through the binding layer.

In an embodiment, the binding layer is a dual-phase nano-amorphous composite layer, and the dual-phase nano-amorphous composite layer contains an amorphous alloy phase composed of the same elements as the amorphous alloy layer and an amorphous metal oxide phase composed of the same elements as the amorphous metal oxide layer.

In an embodiment, the composition of the dual-phase nano-amorphous composite layer is represented by $(Co, Fe, Ta, B)_{1-y}O_y$, wherein $0.1<y<0.46$.

In an embodiment, the composition of the dual-phase nano-amorphous composite layer is represented by $(Co, Fe, Ta, B)_{1-y}O_y$, wherein $0.2<y<0.4$.

In an embodiment, the thickness of the amorphous alloy layer is greater than 20 nm and smaller than 10 μm.

In an embodiment, the thickness of the amorphous metal oxide layer with which the color of the hard coating varies within the visible light spectrum is 50 nm to 300 nm.

In an embodiment, the amorphous metal oxide layer is formed to have different thicknesses on different regions of the amorphous alloy layer, to obtain the hard coating with different colors in the different regions.

In an embodiment, the amorphous metal oxide layer with a thickness gradient is formed on the amorphous alloy layer, and the hard coating with a color gradient is thereby obtained.

A hard coating includes an amorphous alloy layer and an amorphous metal oxide layer with a band gap in a range from 2 eV to 5 eV. The amorphous metal oxide layer is stacked on the amorphous alloy layer, so that the amorphous metal oxide layer and the amorphous alloy layer together form the hard coating. Color of the hard coating is determined by the above-described method for regulating the color of the hard coating.

In an embodiment, a surface roughness of the hard coating is smaller than 0.2 nanometers.

A method for preparing a hard coating with variable color can include the following steps:
  disposing an alloy target and a substrate in a sealed chamber;
  introducing an inert gas into the chamber to form an inert gas atmosphere without oxygen inside the chamber;
  gasifying the alloy target in the inert gas atmosphere without oxygen, to form an amorphous alloy layer on the substrate; and
  introducing a first oxygen gas into the chamber containing the inert gas and atoms ejected from the alloy target, to form an amorphous metal oxide layer with a band gap in a range from 2 eV to 5 eV on the amorphous alloy layer, wherein the amorphous metal oxide layer and the amorphous alloy layer together form the hard coating, and color of the hard coating is capable of varying within the visible light spectrum with thickness of the amorphous metal oxide layer.

In an embodiment, the alloy target is made of iron, cobalt, tantalum, and boron.

In an embodiment, the composition of the alloy target is represented by $(Co, Fe)_a Ta_b B_c$, wherein a, b, and c are atomic percentages, and $35 \leq a \leq 80$, $0 < b \leq 25$, $15 \leq c \leq 25$.

In an embodiment, a ratio of partial pressures of the first oxygen gas to the inert gas is in a range from 0.01 to 0.1.

In an embodiment, before forming the amorphous alloy layer, the method further includes the introduction of a second oxygen gas into the chamber containing the inert gas and atoms ejected from the alloy target, thereby forming a binding layer on the substrate, wherein the binding layer is a dual-phase nano-amorphous composite layer containing an amorphous alloy phase and an amorphous metal oxide phase.

In an embodiment, before introducing the inert gas into the chamber, the method further includes evacuating the chamber so that a vacuum degree in the chamber is lower than $10^{-3}$ Pa.

In the method for regulating the color of the hard coating, the amorphous alloy layer and the amorphous metal oxide layer with the band gap in the range from 2 eV to 5 eV are stacked together. By varying the thickness of the amorphous metal oxide layer, hard coatings in different colors can be obtained. The color of the hard coating can be varied in the entire scope of the visible light spectrum. The method for regulating the color of the hard coating is simple and easy to implement, and the color of the hard coating can vary widely. The color of the hard coating can be determined by using the method for regulating the color of the hard coating. In the method for preparing the hard coating, the predetermined color of the hard coating can be obtained by forming the amorphous alloy layer and the amorphous metal oxide layer with the band gap in the specific range, and by controlling the thickness of the amorphous metal oxide layer. The method is simple and cost effective, and easy to be used in mass production of hard coatings.

DETAILED DESCRIPTION

Figure 1A:
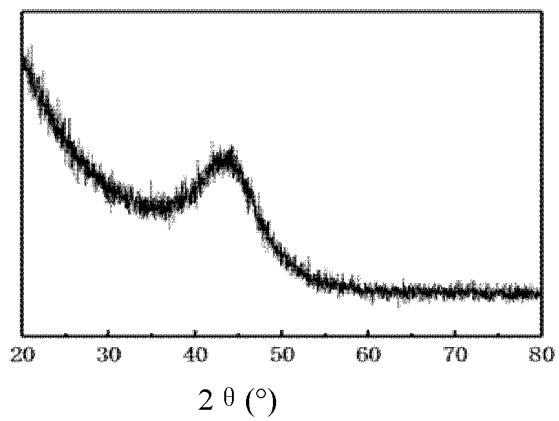
FIG. 1A is an XRD spectrum diagram of an amorphous alloy layer of a hard coating in Example 1 of the present disclosure.

The present disclosure will now be described in detail with reference to the accompanying drawings and embodiments in order to make the objects, technical solutions, and advantages of the present disclosure more clear. It should be understood that the specific embodiments described herein are only for explaining the present disclosure, and not intended to limit the present disclosure.

An embodiment of the present disclosure provides a method for regulating color of a hard coating. The method includes the following steps:

providing an amorphous alloy layer;

forming an amorphous metal oxide layer on a surface of the amorphous alloy layer to stack the amorphous metal oxide layer on the amorphous alloy layer, so that the amorphous metal oxide layer and the amorphous alloy layer together form the hard coating, wherein a band gap of the amorphous metal oxide layer is in a range from 2 eV to 5 eV, and the color of the hard coating is capable of varying within the visible light spectrum with thickness of the amorphous metal oxide layer; and controlling the thickness of the amorphous metal oxide layer in the forming of the amorphous metal oxide layer to obtain the amorphous metal oxide layer of a predetermined color.

In the method for regulating the color of the hard coating, the amorphous alloy layer and the amorphous metal oxide layer with the band gap in the range from 2 eV to 5 eV are stacked together. By varying the thickness of the amorphous metal oxide layer, hard coatings in different colors can be obtained. The color of the hard coating can be varied in the entire scope of the visible light spectrum. The method for regulating the color of the hard coating is simple and easy to implement, and the color of the hard coating can vary widely.

In embodiments of the method for regulating the color of the hard coating, amorphous metal oxide layers with different thicknesses can be formed on different regions of the same amorphous alloy layer on the same substrate, or amorphous metal oxide layers with different thicknesses (each with a constant thickness) can be formed on different substrates. That is, the method can be used to form a hard coating with multiple colors or a hard coating with a single color. In an embodiment, an amorphous metal oxide layer with thickness continuously changing with position (i.e., thickness gradient) can be formed on the amorphous alloy layer, and the hard coating with color continuously changing with position (i.e., color gradient) can be thereby obtained. In another embodiment, two amorphous metal oxide layers with different but constant thicknesses can be formed on two different amorphous alloy layers or on two different regions of one amorphous alloy layer, thereby forming the hard coating with multiple colors.

In the above-described method for regulating the color of the hard coating, the amorphous alloy layer is a light reflection layer, and the material of the amorphous alloy layer is not limited, as long as the amorphous alloy layer has a relatively high light reflectivity. For example, the material of the light reflection layer can include at least one of metals, such as iron, cobalt, tantalum, platinum, gold, silver, copper, or any combination thereof, and/or boron. In an embodiment, the amorphous alloy layer includes iron, cobalt, tantalum, and boron.

The amorphous alloy layer can have such a thickness that the light reflectivity of the amorphous alloy layer is relatively high. When the thickness is too small, the amorphous alloy layer can have a certain degree of light transmission. Therefore, in some embodiments, the thickness of the amorphous alloy layer is greater than 20 nm, so that the amorphous alloy layer has a relatively high hardness and a relatively high wear resistance. In some embodiments, the thickness of the amorphous alloy layer can be in micrometer scale according to actual needs of products to provide better hardness and wear resistance to the amorphous alloy layer. In an embodiment, the thickness of the amorphous alloy layer is smaller than 10 μm.

In an embodiment, the band gap of the amorphous metal oxide layer is in a range from 2.2 eV to 4.5 eV.

In an embodiment, the metal elements contained in the amorphous metal oxide layer are the same as the metal elements contained in the amorphous alloy layer. The metal elements mentioned in the present disclosure include not only metal elements but also metalloid elements. As such, in preparation of the color-variable hard coating, the amorphous alloy layer and the amorphous metal oxide layer can be formed by using the same alloy target, which improves the efficiency of preparing the color-variable hard coating by avoiding the step of replacing the alloy target between the steps of forming of the two layers. The quality of the hard coating is improved as the possibility of contamination on the surface of the amorphous alloy layer, which affects the overall quality of the hard coating, during replacing the alloy target is avoided.

The thickness of the amorphous metal oxide layer with which the color of the hard coating varies within the visible light spectrum is 50 nm to 300 nm. The amorphous metal oxide layer varies in this thickness range can make the color of the hard coating change in the entire visible light spectrum. The color change depends on the thickness change, so that the color can be continuously adjusted.

Specifically, the elements of the amorphous alloy layer can include cobalt, iron, tantalum, and boron; the elements of the amorphous metal oxide layer can include cobalt, iron, tantalum, boron, and oxygen. The color-variable hard coating including the amorphous alloy layer and the amorphous metal oxide layer composed of these elements not only has good color adjustability, but also has excellent hardness, wear resistance, and corrosion resistance. The surface of the hard coating can reach atomic level smoothness, and the roughness of the surface of the hard coating can be smaller than 0.2 nanometers.

In some embodiments, the method further includes a step of providing a substrate and a binding layer disposed on the substrate. The amorphous alloy layer is formed on the binding layer, and is combined with the substrate through the binding layer. The material of the binding layer is not limited, as long as the amorphous alloy layer and the substrate can be well bound together.

In an embodiment, the binding layer is a dual-phase nano-amorphous composite layer. The dual-phase nano-amorphous composite layer is a nano dual-phase composite material, including an amorphous alloy phase and an amorphous metal oxide phase. The elements of the amorphous alloy are the same as those of the amorphous alloy layer. The elements of the amorphous metal oxide are the same as those of the amorphous metal oxide layer. In an embodiment, the composition of the binding layer can be $(Co, Fe, Ta, B)_{1-y}O_y$, wherein $0.1<y<0.46$. In this embodiment, the binding layer is the dual-phase nano-amorphous composite layer. The dual-phase nano-amorphous composite layer includes two phases, one of which is the amorphous alloy, and the other of which is the amorphous metal oxide, improving the adhesion between the substrate and the amorphous alloy layer. In addition, in preparing the color-variable hard coating, the amorphous alloy layer, the amorphous metal oxide layer, and the binding layer can be formed by using the same alloy target. No step of replacing the alloy target is needed. The efficiency for preparing the color-variable hard coating is improved. In addition, the quality of the hard coating is improved as it avoids the possibility of contamination on the surfaces of the binding layer and the amorphous alloy layer, which affects the overall quality of the hard coating, during replacing the alloy target. In an embodiment, the composition of the dual-phase layer is $(Co, Fe, Ta, B)_{1-y}O_y$, wherein $0.2<y<0.4$. The thickness of the binding layer is not limited and can be adjusted according to actual needs of products, as long as the binding layer can provide good adhesion between the substrate and the amorphous alloy layer.

An embodiment of the present disclosure provides a hard coating, including an amorphous alloy layer and an amorphous metal oxide layer with a band gap in a range from 2 eV to eV. The amorphous metal oxide layer is stacked on the amorphous alloy layer, so that the amorphous metal oxide layer and the amorphous alloy layer together form the hard coating. The color of the hard coating is determined by the above-described method for regulating the color of the hard coating.

In the hard coating, the amorphous alloy layer and the amorphous metal oxide layer with the band gap in the range from 2 eV to 5 eV are stacked together. By varying the thickness of the amorphous metal oxide layer, hard coatings in different colors can be obtained. The color of the hard coating can be varied in the entire scope of the visible light spectrum.

Due to the high reflectivity of the amorphous alloy layer, lights entering the hard coating are reflected back to the observer's eyes. Due to the interference between the light reflected by the amorphous alloy layer and the light reflected by the amorphous metal oxide layer, the hard coating at different angles of view also has certain color differences, so that the appearance of the hard coating is color-variable, having excellent visual effects.

An embodiment of the present disclosure provides a method for preparing the hard coating. The method includes the following steps:

disposing an alloy target and a substrate in a sealed chamber;

introducing an inert gas into the chamber to form an inert gas atmosphere without oxygen inside the chamber;

gasifying the alloy target in the inert gas atmosphere without oxygen, to form an amorphous alloy layer on the substrate;

introducing a first oxygen gas into the chamber containing the inert gas and atoms ejected from the alloy target, to form an amorphous metal oxide layer with a band gap in a range from 2 eV to 5 eV on the amorphous alloy layer, wherein the amorphous metal oxide layer and the amorphous alloy layer together form the hard coating, and color of the hard coating is capable of varying within the visible light spectrum with thickness of the amorphous metal oxide layer.

In the method for preparing the hard coating, the color of the hard coating can be changed by controlling the thickness of the amorphous oxide layer. The same alloy target can be used in the preparation process, which improves the production efficiency by avoiding the step of replacing the alloy target, and improves the quality of the hard coating by avoiding the possibility of contamination on the surface of the binding layer and the surface of the amorphous alloy layer during replacing the alloy target, as the contamination will affect the quality of the overall hard coating. The method is simple, and easy to be used in mass production of hard coatings. In addition, the method can prepare hard coatings in multiple colors in the same equipment and using the same alloy target as the raw material, which is economical and practical, and greatly reduces the production cost.

In an embodiment, the alloy target is made of iron, cobalt, tantalum, and boron. The color-variable hard coating prepared by the alloy target has relatively high hardness, high wear resistance, good corrosion resistance, etc., and the energy band gap of the prepared amorphous metal oxide layer is between 2 eV and 5 eV, which results in good color adjustability of hard coating. In an embodiment, the composition of the alloy target can be $(Co, Fe)_aTa_bB_c$, wherein a, b, and c are atomic percentages, and $35 \leq a \leq 80$, $0 < b \leq 25$, $15 \leq c \leq 25$.

Further, by adjusting the ratio of partial pressures of the first oxygen gas to the inert gas in the chamber, the ratio between the elements in the amorphous metal oxide layer can be adjusted. In some embodiments, the ratio of the partial pressures of the first oxygen gas to the inert gas is 0.04 to 0.1, and in an embodiment, is 0.05 to 0.08. By adjusting the partial pressure of the first oxygen gas, the composition of the amorphous metal oxide layer can be adjusted.

In another embodiment, before forming the amorphous alloy layer, the method for preparing the color-variable hard coating further includes the introduction of a second oxygen gas into the chamber containing the inert gas and atoms ejected from the alloy target. Thereby, a binding layer is formed on the substrate. The binding layer is a dual-phase nano-amorphous composite layer containing an amorphous alloy phase and an amorphous metal oxide phase.

The second oxygen gas can be introduced into the chamber together with the inert gas, or the two gases can be separately introduced into the chamber. In the process of forming the binding layer, the atmosphere in the chamber is a mixture of the inert gas and the oxygen gas. In an embodiment, a ratio of the partial pressures of the second oxygen gas to the inert gas is smaller than or equal to 0.04. By adjusting the partial pressure of the second oxygen gas, the composition of the amorphous metal oxide in the binding layer can be adjusted. In an embodiment, the second oxygen gas and the first oxygen gas are from the same oxygen source, but in different partial pressures in the chamber.

In the present embodiment, when the binding layer is formed, the introduction of the oxygen gas is suspended, and the oxygen gas in the chamber is then completely evacuated by vacuuming the chamber or continuously introducing the inert gas into the chamber for a period of time, so that the alloy target can be gasified, e.g., sputtered, and formed into the amorphous alloy layer in the inert gas atmosphere containing no oxygen. In some embodiments, the thickness of each layer of the hard coating, especially the thickness of the amorphous metal oxide layer, can be controlled by changing the deposition time from the alloy target onto the substrate or changing the angle between the substrate and the alloy target. In an embodiment, by moving the substrate, the deposition times of the sputtered layer from the alloy target on different regions of the substrate are different from each other, so as to form the layers with different thicknesses. In another embodiment, during the deposition of the sputtered layer from the alloy target, the substrate can be rotated to change the angle, thereby forming the layer with varied thickness on different regions of the substrate. As such, the layers with different thicknesses are obtained. These steps are especially suitable for changing the thickness of the amorphous metal oxide layer, so that the hard coating with color gradient can be obtained. In another embodiment, the substrate is fixed, a hard coating including an amorphous metal oxide layer with a first thickness is formed on a first region of the substrate, and another hard coating including another amorphous metal oxide layer with a second thickness is formed on a second region of the substrate, so as to obtain two hard coatings with two different colors; similarly, one hard coating with multiple color regions also can be obtained. By forming the hard coating including multiple amorphous metal oxide layers in different thicknesses on different regions of the same amorphous alloy layer and on the same substrate, a multi-color hard coating can be obtained, which makes the hard coating have a better visual effect.

The inert gas can be continuously introduced into the chamber during the steps of forming the binding layer, the amorphous alloy layer, and the amorphous metal oxide layer. In an embodiment, before introducing the inert gas into the chamber, the method for preparing the color-variable hard coating further includes evacuating the chamber. A vacuum degree in the chamber, in an embodiment, is lower than $10^{-3}$ Pa, and in another embodiment, is lower than $10^{-4}$ Pa.

In some embodiments, the material of the substrate is metal, polymer, glass, ceramic, and so on.

In some embodiments, the inert gas is argon gas. In all the embodiments, the purity of the argon gas is 99.999 wt %.

The method for preparing the color-variable hard coating can be a physical vapor deposition method, such as magnetron sputtering, evaporation, pulsed laser deposition, molecular beam epitaxy, etc.; chemical vapor deposition, such as laser enhanced chemical vapor deposition, plasma enhanced chemical vapor deposition, metal organic chemical vapor deposition, etc.; or thermal spraying, etc.

The composition and other characteristics of the color-variable hard coating obtained by the method for preparing the color-variable hard coating, as well as the corresponding technical effects, are described in the description for the method for regulating the color of the hard coating and the color-variable hard coating, and therefore will not be repeated again.

Example 1: Preparation of a Golden Colored Hard Coating

A $Co_{45}Fe_{21}Ta_{10}B_{24}$ alloy target is taken as the raw material. A white $Al_2O_3$ ceramic substrate is disposed in the chamber of the equipment of magnetron sputtering. The chamber is previously evacuated to the pressure below 10-4 Pa. Then an argon gas and an oxygen gas are introduced into the chamber, and the ratio of the partial pressures of the oxygen gas to the argon gas is 0.03, to sputter a binding layer whose composition is $Co_{25.2}Fe_{8.3}Ta_{6.4}B_{19.5}O_{40.6}$ on the substrate. The binding layer is a two-phase nano composite structure including an amorphous alloy phase and an amorphous metal oxide phase. Then the inlet valve for the oxygen gas is closed, and a single-phase Co—Fe—Ta—B amorphous alloy layer, whose composition is $Co_{55}Fe_{24.5}Ta_{0.1}B_{20.4}$ and thickness is larger than 20 nm, is sputtered on the binding layer in the argon gas atmosphere. Then the inlet valve for the oxygen gas is re-opened, and a single-phase amorphous metal oxide layer with a thickness of 120 nm is sputtered on the amorphous alloy layer in the atmosphere of the mixed gases with the ratio of the partial pressures of the oxygen gas to the argon gas of 0.06. The composition of the amorphous metal oxide layer is $Co_{19.1}Fe_{7.8}Ta_{7.6}B_{18.6}O_{46.9}$.

Figure 1B:
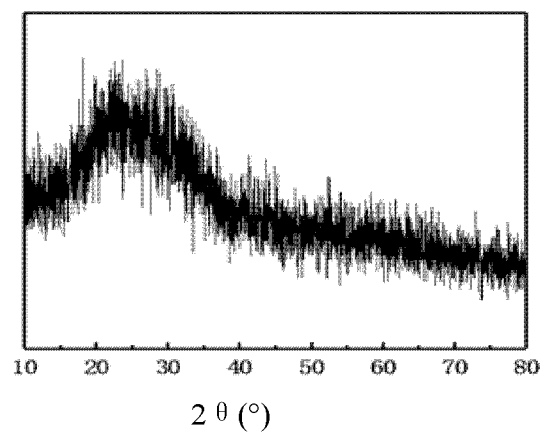
FIG. 1B is an XRD spectrum diagram of an amorphous metal oxide layer of the hard coating in Example 1 of the present disclosure.
Figure 1C:
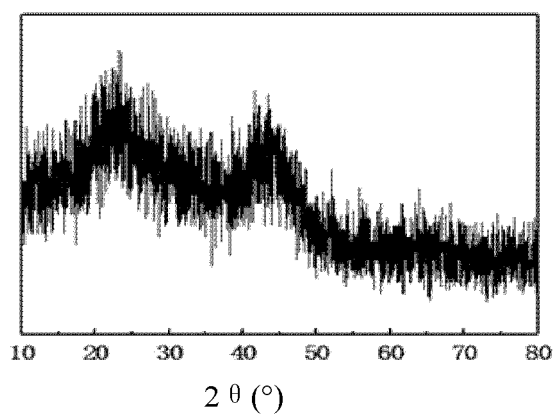
FIG. 1C is an XRD spectrum diagram of a binding layer of the hard coating in Example 1 of the present disclosure.
Figure 2:
FIG. 2 is a photograph showing the hard coatings in Example 1 of the present disclosure.

Referring to FIG. 1A, FIG. 1B, and FIG. 1C, each layer in the hard coating obtained in this example is in an amorphous state. Referring to FIG. 2, the hard coating is in a golden color.

Example 2: Preparation of a Blue Colored Hard Coating

The preparation in Example 2 is substantially the same as that in Example 1, except that the substrate is a black ceramic substrate, and the thickness of the amorphous metal oxide layer is 180 nm.

Figure 3A:
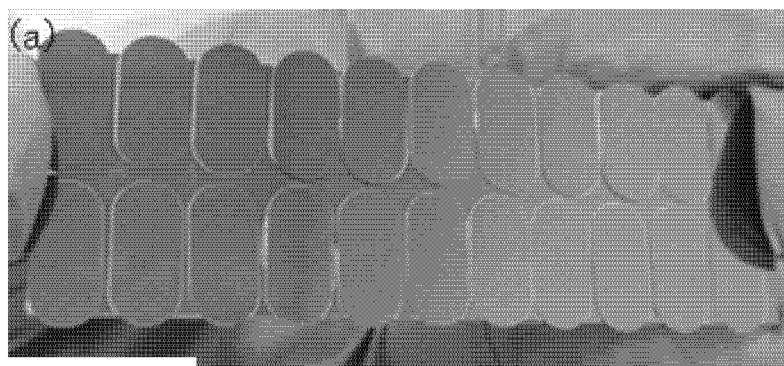
FIG. 3A to FIG. 3C are photographs showing the hard coatings in Example 2 of the present disclosure at different angles of view.
Figure 3B:
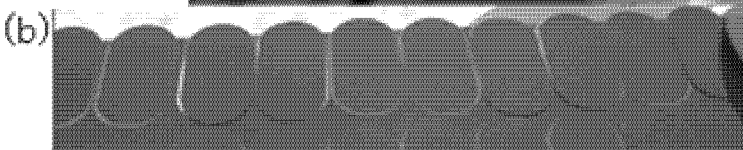
Figure 3C:

The XRD pattern and atomic force microscopic image of the sample prepared in Example 2 are similar to the sample obtained in Example 1, and are therefore not shown. Referring to FIG. 3A, when the sample is viewed from the front, the hard coating is blue. Referring to FIG. 3B and FIG. 3C, when the sample is viewed from the side, the hard coating is purple. In this example, the hard coating is in different colors when viewed at different angles.

Example 3: Preparation of an Iridescent Colored Hard Coating

The preparation in Example 3 is substantially the same as that in Example 1, except that the substrate is quartz glass, and the thickness of the amorphous metal oxide layer continuously varies from 50 nm to 300 nm with the position on the substrate.

Figure 4:
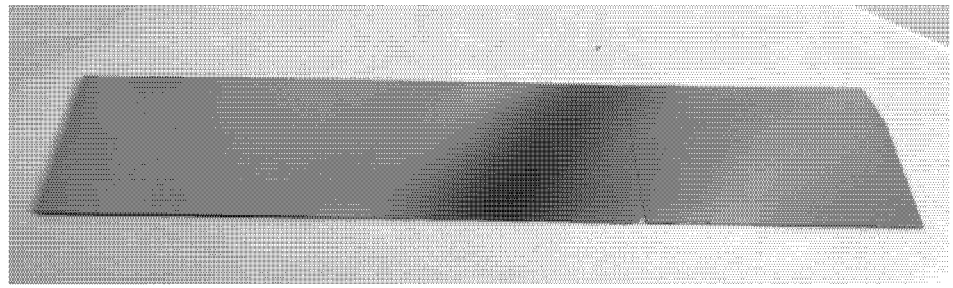
FIG. 4 is a photograph showing the hard coating in Example 3 of the present disclosure.
Figure 6:
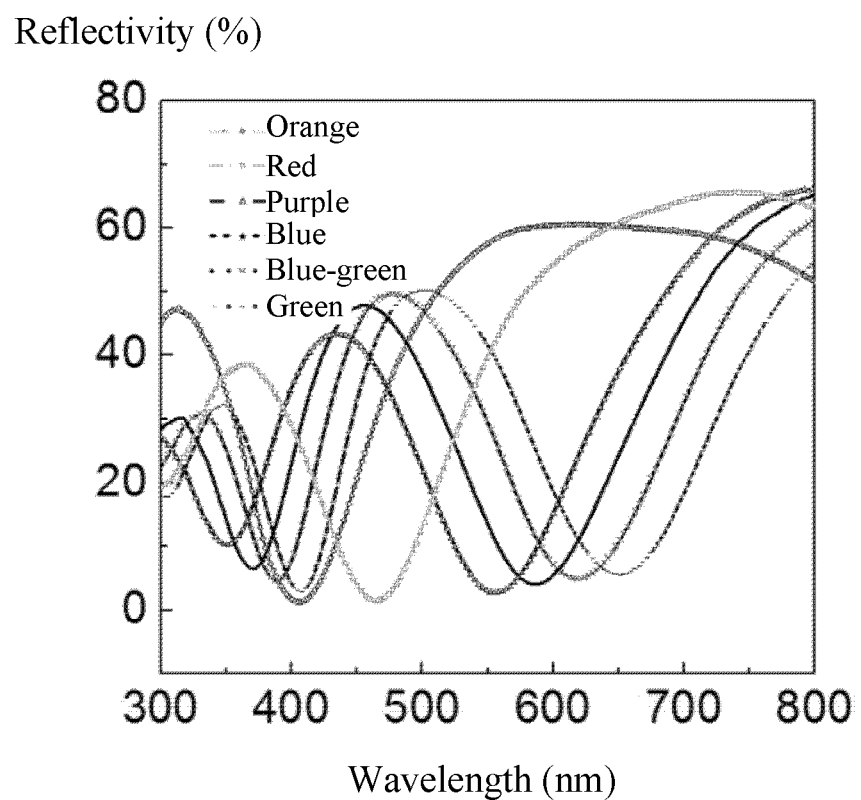
FIG. 6 is a reflection spectrum diagram of different colored regions of the hard coating in Example 3 of the present disclosure.

Example 3 provides a method for preparing a multi-color hard coating. Referring to FIG. 4, by continuously changing the thickness of the amorphous metal oxide layer with the position on the amorphous alloy layer, the hard coating shows different colors, which form a color gradient on the hard coating. The XRD pattern and atomic force microscopic image of the sample in Example 3 are similar to the sample in Example 1, and are therefore not shown. Referring to FIG. 6, different regions of the hard coating sample reflect lights with different wavelengths, that is, different regions of the hard coating have different reflectivity to different colored lights.

Example 4: Preparation of an Iridescent Colored Hard Coating

The preparation in Example 4 is substantially the same as that in Example 3, except that the hard coating is formed in the shape as the second gate of the Tsinghua University.

Figure 5:
FIG. 5 is a photograph showing the hard coating in Example 4 of the present disclosure.

The XRD pattern, reflection spectrum, and atomic force microscope image of the sample prepared in Example 4 are similar to those of the sample prepared in Example 3, and are therefore not shown. Referring to FIG. 5, the hard coating is an opaque hard coating, which can cover the text on the paper under the glass substrate.

The technical features of the above-mentioned embodiments can be combined arbitrarily. In order to make the description concise, not all possible combinations of the technical features are described in the embodiments. However, as long as there is no contradiction in the combination of these technical features, the combinations should be considered as in the scope of the present disclosure.

The above-described embodiments are only several implementations of the present disclosure, and the descriptions are relatively specific and detailed, but they should not be construed as limiting the scope of the present disclosure. It should be understood by those of ordinary skill in the art that various modifications and improvements can be made without departing from the concept of the present disclosure, and all fall within the protection scope of the present disclosure. Therefore, the patent protection of the present disclosure shall be defined by the appended claims.

What is claimed is:

1. A method for regulating color of a hard coating, comprising:

providing a substrate and a binding layer deposited on the substrate;

forming an amorphous alloy layer on the binding layer in order to adhere to the substrate through the binding layer;

forming an amorphous metal oxide layer on a surface of the amorphous alloy layer to stack the amorphous metal oxide layer on the amorphous alloy layer, so that the amorphous metal oxide layer and the amorphous alloy layer together form the hard coating, wherein a band gap of the amorphous metal oxide layer is in a range from 2 eV to 5 eV, and the color of the hard coating is capable of varying within the visible light spectrum with thickness of the amorphous metal oxide layer; and controlling the thickness of the amorphous metal oxide layer during the formation of the amorphous metal oxide layer in order to obtain a predetermined color on a surface of the amorphous metal oxide layer;

wherein the binding layer is a dual-phase nano-amorphous composite layer, and the dual-phase nano-amorphous composite layer contains an amorphous alloy phase composed of the same elements as the amorphous alloy layer and an amorphous metal oxide phase composed of the same elements as the amorphous metal oxide layer.

2. The method of claim 1, wherein the band gap of the amorphous metal oxide layer is in a range from 2.2 eV to 4.5 eV.

3. The method of claim 1, wherein except for oxygen element contained in the amorphous metal oxide layer, the amorphous alloy layer and the amorphous metal oxide layer are composed of the same elements.

4. The method of claim 3, wherein the elements of the amorphous alloy layer are cobalt, iron, tantalum, and boron; the elements of the amorphous metal oxide layer are cobalt, iron, tantalum, boron, and oxygen.

5. The method of claim 1, wherein the composition of the amorphous metal oxide layer is represented by $(Co, Fe, Ta, B)_{1-x}O_x$, wherein $0.46<x<1$.

6. The method of claim 1, wherein the composition of the dual phase nano amorphous composite layer is represented by $(Co, Fe, Ta, B)_{1-y}O_y$, wherein $0.1<y<0.46$.

7. The method of claim 1, wherein the composition of the dual-phase nano-amorphous composite layer is represented by $(Co, Fe, Ta, B)_{1-y}O_y$, wherein $0.2<y<0.4$.

8. The method of claim 1, wherein the thickness of the amorphous alloy layer is greater than 20 nm and smaller than 10 μm.

9. The method of claim 1, wherein the thickness of the amorphous metal oxide layer with which the color of the hard coating varies within the visible light spectrum is 50 nm to 300 nm.

10. The method of claim 1, wherein the amorphous metal oxide layer is formed to have different thicknesses on different regions of the amorphous alloy layer, to obtain the hard coating with different colors in the different regions.

11. The method of claim 10, wherein the amorphous metal oxide layer with a thickness gradient is formed on the amorphous alloy layer, and the hard coating with a color gradient is thereby obtained.

* * * * *